United States Patent [19]

Tuttle

[11] Patent Number: 5,021,734
[45] Date of Patent: Jun. 4, 1991

[54] IN-LINE COAXIAL SURGE PROTECTOR AND TEST FIXTURE

[75] Inventor: John E. B. Tuttle, Falls Church, Va.

[73] Assignee: The United States of America as represented by the Secretary of the Army, Washington, D.C.

[21] Appl. No.: 584,665

[22] Filed: Sep. 14, 1990

[51] Int. Cl.[5] .............................................. G01R 31/22
[52] U.S. Cl. .............................. 324/158 F; 324/158 R
[58] Field of Search ............... 324/158 R, 158 F, 73.1, 324/102; 361/119, 118, 129

[56] References Cited

U.S. PATENT DOCUMENTS

| | | | |
|---|---|---|---|
| 2,857,558 | 10/1958 | Fiske | 324/158 R |
| 2,951,185 | 8/1960 | Buck | 324/158 R |
| 3,898,561 | 8/1975 | Leighton, Sr. | 324/158 R |
| 4,952,869 | 8/1990 | Tuttle | 324/127 |

Primary Examiner—Kenneth Wieder
Assistant Examiner—Vinh P. Nguyen
Attorney, Agent, or Firm—Saul Elbaum; Paul S. Clohan; Guy M. Miller

[57] ABSTRACT

A Surge Protection Device Test Fixture having a metallic housing with a brass coverplate, the housing having an input coaxial connector and an output coaxial connector mounted on either end, a bare wire conductor connecting the center conductor of the input coaxial connector to the center conductor of the output coaxial connector, a teflon holder located within the housing for holding a surge protection device and positioned so as to allow the surge protection device to make contact with the bare wire conductor, an adjustable contact screw for providing a conducting path between the brass coverplate and the surge protection device, a coil for inductively sensing a current through the surge protection device, a coil for inductively sensing a current through the bare wire conductor, and a coil for inductively sensing a current on the outside of the housing.

5 Claims, 2 Drawing Sheets

IN-LINE COAXIAL SURGE PROTECTOR AND TEST FIXTURE

RIGHTS OF THE GOVERNMENT

The invention described herein may be manufactured, used and licensed by or for the United States Government for Governmental Purposes without payment to me of any royalty thereon.

BACKGROUND OF THE INVENTION

The present invention relates to surge protection devices and more particularly to a surge protector and test fixture with triple current sensing and voltage pick-off.

Many military radio communications and other electronic systems have a requirement to survive the electromagnetic pulse (EMP) that would result from a nuclear detonation at high altitude. Nuclear detonations at high altitude are known to cause intense bursts of electromagnetic energy that will illuminate very large areas of the Earth's surface. Electronic equipment within the area illuminated by the EMP is susceptible to damage from the incident EMP wavefront. In general, the susceptible equipment is contained within electro-magnetically shielded enclosures such as equipment shelters. Although such equipment may be electromagnetically shielded, energy sufficient to cause damage may be coupled into the enclosure. The primary mechanism by which energy from an EMP event may enter the equipment is conductive penetration to the wall of the enclosure by exterior cables. Typically these cables connect equipment at varying distances from the enclosure. These distant equipments may include AC power generating equipment, antenna masts, or other shelterized equipment. The cables connecting the physically separated items may behave as antennas which respond to a incident EMP wavefront causing voltage transients to appear at the equipment interfaces. This equipment, unless protected, may be damaged by the EMP event.

Methods available to protect shielded equipment from EMP induced damage are generally referred to as treatment of penetrations. These methods include shielding of cables and the use of Terminal Protection Devices (TPD's). Effective shielding of cables requires that all conductors comprising the cable (i.e., individual wires and wire pairs) be completely surrounded by a metal shield which is continuous with and circumferentially bonded to the walls of the equipment enclosures at both ends of the cable. When end to end shielding of exterior cabling is not possible, TPD's should be used. TPD's are of two general categories; linear and non-linear. The term linear TPD refers to a broad range of commercially available encapsulated filters enclosed in metal shields; these are grounded to the walls of the shielded enclosure in which the protected equipment is located. Examples include AC power line RFI filters, data line filters, and coaxial RF high pass filters. The term non-linear TPD refers to a broad range of devices which limit voltage by clamping or by arc breakdown. Examples of the former are metal oxide varistors (MOV's) and bipolar zener diodes. The latter category are gas discharge tubes or spark gaps. These protect equipment by creating a momentary short circuit across the input to the equipment when the amplitude of an offending transient exceeds the voltage breakdown threshold of the device. At breakdown, an arc discharge occurs within the device which provides a path to ground for currents induced on an exterior conductor by the EMP event. The arc discharge persists for the duration of the transient that caused the voltage breakdown Many gas discharge devices are contained within a coaxial package and are advertised as fast acting devices. These were devised to provide protection to RF transmitters and receivers in the HF and VHF frequency ranges. For these systems, the spectrum of an incident EMP wavefront contains frequency components within the passband of HF and VHF antennas. When the antenna is excited from an incident wavefront, a high voltage fast rise-time transient will appear at the equipment. For the equipment to be protected, the protective device must have sufficient activation speed to limit the amplitude and duration of the transient below previously established damage threshold. If the protective device has sufficient speed in relation to the voltage rate of rise (volts/second) of the transient, it will enter breakdown and the equipment will be protected; if not, the device may fail to activate and the equipment may be damaged. It is well known that the activation or breakdown voltage of gas tube TPD's increases as the rate of rise (volts/time) of an applied voltage stress increases. What is not well known is that the breakdown voltage vs rate of rise characteristic may change for some devices with time and usage and the tendency to vary is manufacturer dependent. In other words, a device, when installed in a system, may fail to activate at a crucial time. Thus, there is a great need to test a large number of devices from different manufacturers to determine the activation characteristics both initial and long term. Prior to installation in a system, protective devices should be pulse tested so that marginal devices can be rejected. After installation, a device should be periodically pulse tested to determine if replacement is necessary.

OBJECTS AND SUMMARY OF THE INVENTION

It is an object of the present invention to provide a fixture that allows rapid replacement of devices and measurement of device responses to an applied stimulus.

Another object of the invention is to provide a fixture that can be utilized as a protective device in installed systems to facilitate periodic measurement of protection device responses.

A further object of the invention is to provide a fixture with integral current and voltage sensing capability which will also allow the coaxial cable to which the fixture is attached to be periodically tested for shield flaws and other forms of degradation.

A still further object of the invention is to provide fixture with the ability to monitor digital and video message streams in a coaxial system and the ability to measure RF transmitter output.

Described herein is a fixture which can be inserted into coaxial transmission lines of military and commercial communications systems for purposes of EMP or lightning protection, system diagnostics, and signal monitoring. When the EMP/lightning protection feature is used, a selected surge protection device such as a cartridge type gas filled spark gap is placed in the fixture to protect the host system equipment from overvoltage transients induced by EMP or lightning. With or without the EMP/lightning protection feature, the fixture can be used to monitor digital message streams, video data transmissions, and RF transmitter outputs. In addition, the fixture may be used to detect flaws in the shields of the coaxial lines in which it is inserted. The fixture can also be used in laboratory, bench, and production line environments, to characterize and test various surge protection devices.

When used in combination with the appropriate measuring instrument (e.g., oscilloscope, spectrum analyzer, or RF voltmeter), the fixture provides the capability to sample, measure, or monitor time varying (pulsed or continuous wave) currents and voltage as listed below:

(a) Coaxial center conductor current.
(b) Coaxial shield current.
(c) Surge protection device current.
(d) Voltage, center conductor to shield.

The capability to obtain three measurements of current is provided by three independent current sensors integral to the fixture. These provide a time varying output voltage proportional to the current flowing in the selected area of the fixture when sensor outputs are connected to a measuring instrument whose input impedance is 50 ohms. The outputs of these sensors are available from three miniature coaxial connectors (SMA series) on the walls of the fixture. The capability to measure voltage (referred to as voltage pickoff) is via a hard wire connection from the coaxial center conductor to a coaxial "tip jack" on one wall of the fixture. The tip jack is a miniature coaxial connector into which a conventional high impedance oscilloscope probe may be inserted. By means of these probes, the voltage to be measured may be divided by one, ten, or one hundred as required.

DETAILED DESCRIPTION OF THE PREFERRED EMBODIMENTS

Figure 1:
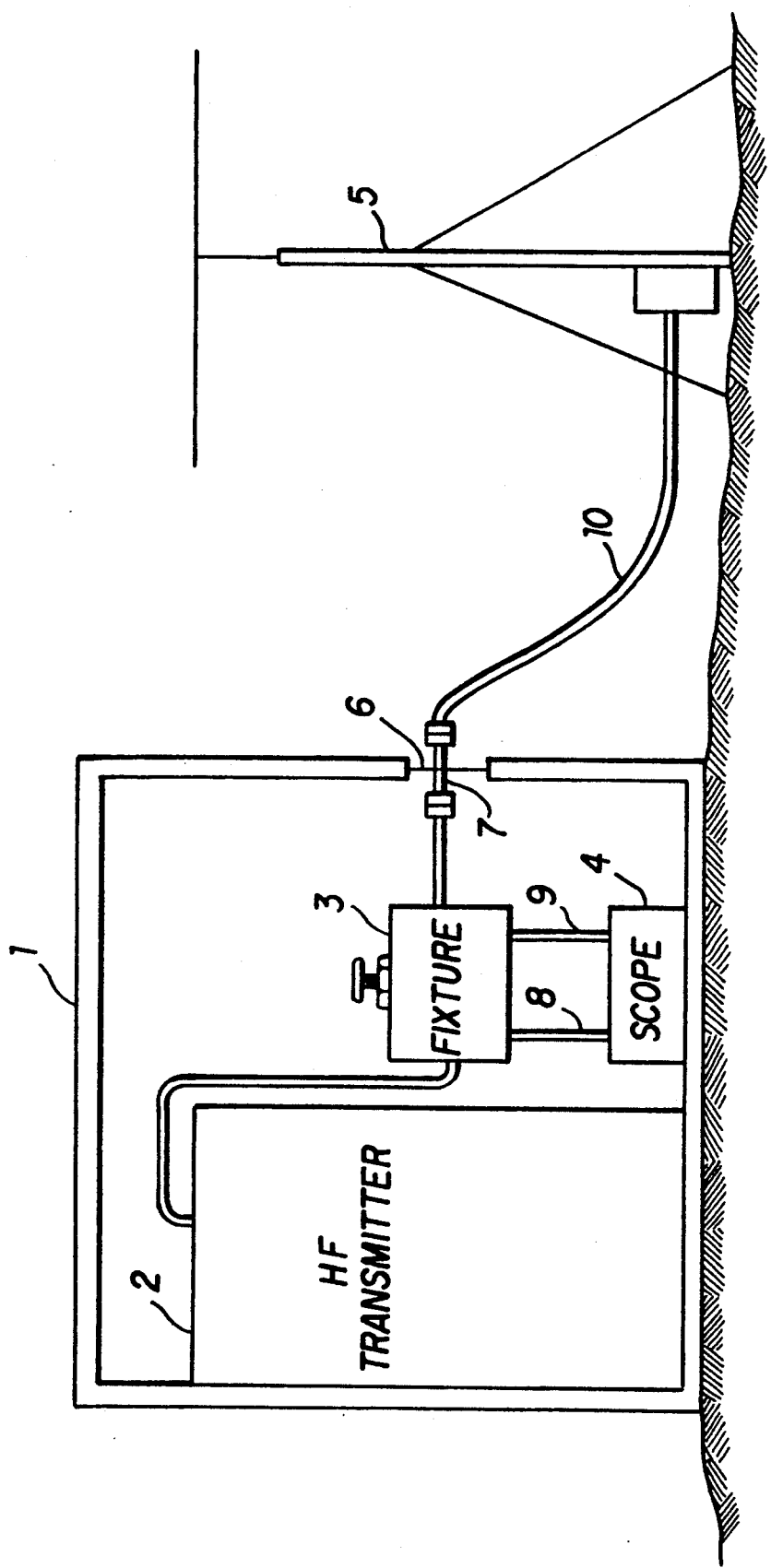
FIG. 1 is a schematic depiction of a typical operating environment for the in-line coaxial surge protector and test fixture.

FIG. 1 shows a typical operating environment in which the in-line coaxial surge protector and test fixture 3 is used. In this environment, the output of an HF transmitter 2 located within shelter 1 is monitored by fixture 3 and a two channel oscilloscope 4. The fixture 3 outputs for coaxial center conductor current, shield current, protection device current, and for voltage are connected to the inputs of the oscilloscope in a conventional manner via cables 8 and 9. The resulting display on oscilloscope 4 would be sine waves of voltage and current which allows the operator to observe differences in phase between transmitter 2 output voltage and current as well as measure amplitudes. In this environment, fixture 3 can also be used to perform such measurements as shield integrity of exterior coaxial cable 10 which runs from antenna mast 5 thru shelter 1 wall via feed-thru connector 7. For that case, transmitter 2 is turned off, fixture 3 is repositioned to the exterior side of connector entry panel 6, and the measurement is performed in-situ. A low level radiating cw source is used to excite cable 10 and a sensitive cw receiver, RF voltmeter, or spectrum analyzer (i.e., a device with 50 ohm input) is used as the measuring instrument. For this measurement, the shield current sensor (on the outside surface of fixture 3) and the center conductor current sensor (see FIG. 2 for these items) is used. The measure of shielding integrity is the ratio of shield current to center conductor, the current expressed in decibels (dB) in a 100 megahertz bandwidth.

Figure 2:
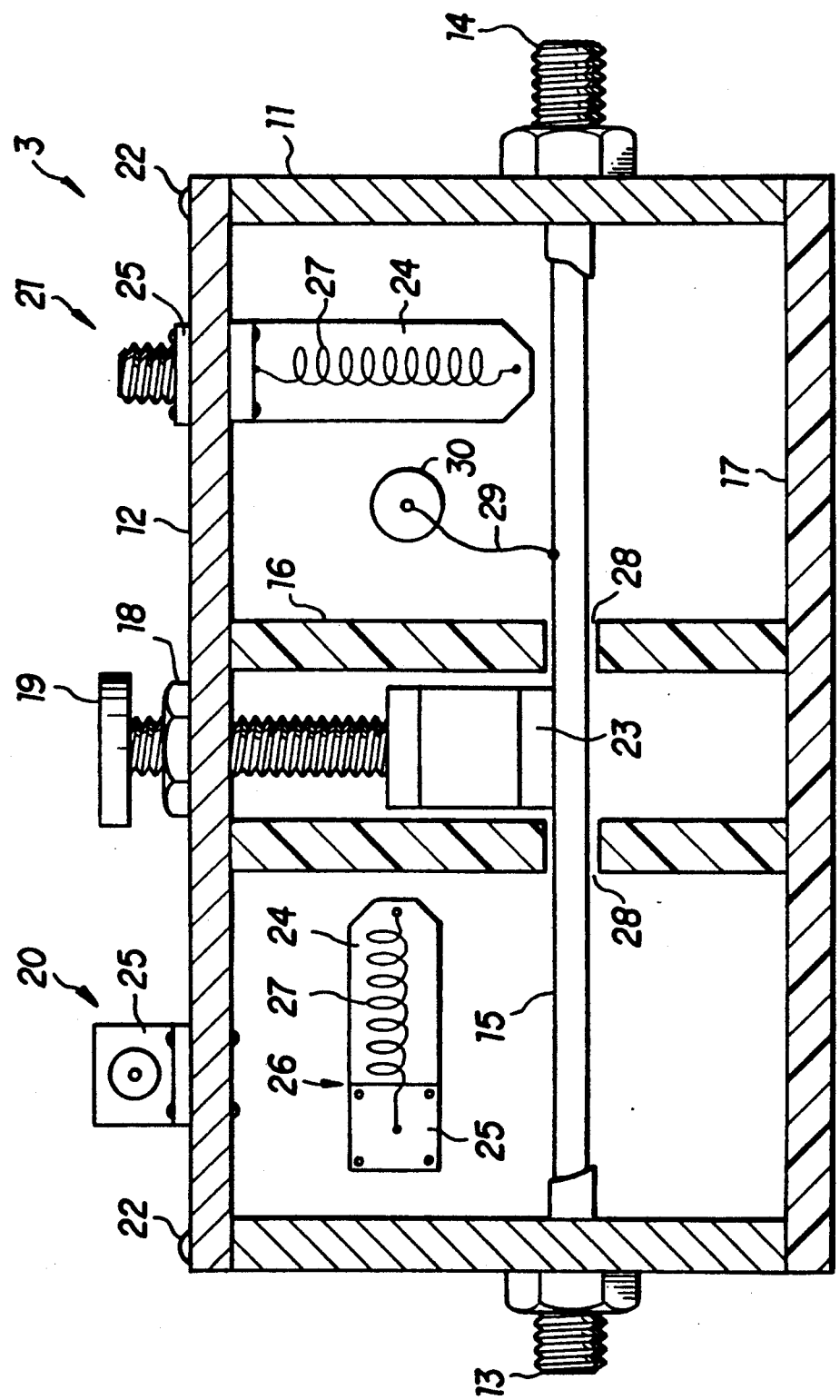
FIG. 2 is a cross-sectional view of an embodiment of the in-line coaxial surge protector and test fixture according to the present invention.

The details of fixture 3 are shown in FIG. 2. By way of example only, an in-line coaxial surge protector and test fixture 3 was built using a commercial molded aluminum box 11 with dimensions of $2_{17/4}'' \times 1\frac{1}{4}'' \times 1\frac{1}{4}''$ with a painted finish and a customized removable top coverplate 12. The commercial box 11 was modified by the addition of two type N coaxial panel jacks 13 and 14 on either side, a bare solid copper coaxial center conductor 15 soldered between jacks 13 and 14, a surge protection device to be tested holder 16 which is cylindrical, made from teflon, has a plastic mounting base 17, and a thru-hole 28 to allow center conductor 15 to pass through, and a surge protection device current inductive current sensor 26 with SMA output connector 25. The capability to measure voltage (referred to as voltage pickoff) is via a hard wire 29 connection from the coaxial center conductor 15 to a coaxial "tip jack" 30 on one wall of the fixture. Tip jack 30 is a miniature coaxial connector into which a conventional high impedance oscilloscope probe may be inserted. A surge protection device to be tested, for example a button cartridge, is depicted as item 23 to exemplify the use of device to be tested holder 16. The standard top coverplate supplied by the manufacturer with box 11 was replaced with a 1/16" thick brass coverplate 12. Brass coverplate 12 was modified by the addition of a threaded bushing 18 with mating contact screw 19, a shield current inductive current sensor 20 and a center conductor inductive current sensor 21 each having an SMA output connector 25, a brass mounting strip 24, and an inductive coil 27. A detailed description of inductive current sensors 20, 21 and 26 can be found in my recently issued U.S. Pat. No. 4,952,869 which is hearby incorporated by reference. Paint was removed from the rim of box 11 to facilitate contact between brass coverplate 12 and the rim of box 11. Brass coverplate 12 is fastened to box 11 by four screws 22 at the corners.

An aspect of the present invention in common with the above mentioned U.S. patent is the application of a novel current sensing technique. By this technique, ordinary solenoid wound ferrite core inductors 27, which can be purchased cheaply in large quantities, are used to sample pulsed or continuous wave currents from a test point without the requirement to physically surround it or to be in direct contact with it. These inductors, when oriented perpendicular to a conductor carrying a time varying current, will be excited by lines of magnetic flux (not shown but well understood in the art) emanating from the conductor. If the excited inductor is loaded by a low valued resistance or a transmission line terminated in its characteristic impedance, it will produce an output voltage proportional to the time varying current flowing in the conductor. By use of this technique, current sensors with flat frequency response characteristics between 100 KHz and well beyond 100 MHz have been fabricated.

Surge protection device current inductive current sensor 26, used to sample surges through the surge protection device to be tested 23, is mounted in box 11 with its axis parallel to coaxial center conductor 15. When a surge protection device to be tested 23 is in place in holder 16 and is forced into a conduction between coaxial center conductor 15 and contact screw 19, current flows from coaxial center conductor 15 to coverplate 12 of box 11 via the device to be tested 23. It can be seen that current flow is perpendicular to surge protection device current inductive current sensor 26 inductive coil 27 axis and rings of flux emanating from the surge protection device to be tested 23 excite the sensor inductive coil 27. In a similar fashion, center conductor current inductive current sensor 21, used to sample coaxial center conductor 15 current, is oriented perpendicular to coaxial center conductor 15 and thus to the direction of the current through coaxial center conductor 15. It can be seen that current flow is perpendicular to center conductor current inductive current sensor 21 coil 27 axis and rings of flux emanating from coaxial center conductor 15 excite the sensor inductive coil 27. Likewise, shield current inductive current sensor 20 is used to sample current on the outer surface of box 11 and is oriented perpendicular to the long dimension of box 11 and to the direction of current flow through box 11. Shield current inductive current sensor 20 will be excited by flux rings which surround box 11. The calibration factors for these three inductive sensors are expressed as volts per amp when each is loaded by terminated 50 ohm coaxial cable.

In a test of an in-line coaxial surge protector and test fixture 3, the surge protection devices to be tested 23 were subjected to medium voltage (300 to 800 volts) rectangular pulses of 150 nanosecond duration and the response waveforms were obtained for voltage and surge current. The devices that were tested were button type cartridges that are normally inserted into a coaxial fixture supplied by the manufacturer and therefore there is normally no provision for direct sampling of current through the device. In this case, if the waveform of surge current through the device is required, it must be obtained from the waveform of current sampled from the coaxial center conductor, and no the test device. Therefore, the current sampled at this point will not be device surge current since the generator supplying pulses to the test device must be terminated in a resistive load (Z=50 ohms). The current at this point will be the sum of device surge current plus termination resistor current. Thus, to obtain the waveform of current through the device, two waveforms must be recorded which must be processed to extract the desired current-time waveform This, of course, is not necessary when the present invention is used to sample the current through the device to be tested.

In the prior art method of current measurements, broadband current transformers with excellent frequency response characteristics and the capability to withstand heavy current surges were available from several sources but were expensive and inconvenient to use. These current transformers such as the Tektronix CT-1 and CT-2 utilize small broadband ferrite toroids which must physically surround the test point to which they are attached. Installation of a CT-1 or CT-2 into a breakout box required the insertion of the coaxial center conductor into the opening of the toroidal core and modification of the box to provide mechanical stability. Once mounted in the box, the expensive current transformer was committed to permanent or semi-permanent use in that enclosure. This expensive commitment has been eliminated by the present invention.

To those skilled in the art, many modifications and variations of the present invention are possible in light of the above teachings. It is therefore to be understood that the present invention can be practiced otherwise than as specifically described herein and still will be within the spirit and scope of the appended claims.

I claim:

1. A Surge Protection Device Test Fixture Comprising:
   a metallic housing having a conducting coverplate;
   said housing having an input coaxial connector and an output coaxial connector mounted thereon;
   a bare conductor connecting the center conductor of the input coaxial connector to the center conductor of the output coaxial connector;
   a non-metallic holder disposed within said housing for holding a surge protection device and positioned so as to allow said surge protection device to make contact with said bare conductor;
   means for providing a conducting path between said conducting coverplate and said surge protection device;
   means for inductively sensing a current through said surge protection device;
   means for inductively sensing a current through said bare conductor;
   means for inductively sensing a current on the outside of said housing.

2. The device of claim 1 wherein said conducting coverplate is made from brass.

3. The device of claim 1 wherein said non-metallic holder comprises a cylindrical housing made from teflon.

4. The device of claim 1 wherein said means for providing a conducting path between said conducting coverplate and said surge protection device comprises a threaded screw removeably located on said coverplate.

5. The device of claim 1 wherein said means for inductively sensing a current through said surge protection device, said bare conductor, and the outside of said housing each comprises an electrical output connector with a brass strip affixed thereto and an inductive coil mounted on said brass strip.

* * * * *